United States Patent
Sofia et al.

(10) Patent No.: US 10,666,289 B1
(45) Date of Patent: May 26, 2020

(54) DATA COMPRESSION USING DICTIONARY ENCODING

(71) Applicant: International Business Machines Corporation, Armonk, NY (US)

(72) Inventors: Anthony Thomas Sofia, Hopewell-Junction, NY (US); Brad Stilwell, Poughkeepsie, NY (US); Matthias Klein, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/249,029

(22) Filed: Jan. 16, 2019

(51) Int. Cl.
*H03M 7/40* (2006.01)

(52) U.S. Cl.
CPC .................. *H03M 7/40* (2013.01)

(58) Field of Classification Search
USPC .............................. 341/51, 65, 67
See application file for complete search history.

(56) References Cited

U.S. PATENT DOCUMENTS

| | | | |
|---|---|---|---|
| 7,433,824 B2 | 10/2008 | Mehrotra et al. | |
| 7,562,021 B2 | 7/2009 | Mehotra et al. | |
| 8,090,574 B2 | 1/2012 | Mehrotra et al. | |
| 8,497,788 B1 * | 7/2013 | Miller | H03M 7/30 341/51 |
| 8,610,604 B2 * | 12/2013 | Glass | H03M 7/6076 341/51 |
| 8,659,452 B2 * | 2/2014 | Cho | H03M 7/30 341/107 |

FOREIGN PATENT DOCUMENTS

EP 0663740 A2 7/1995

OTHER PUBLICATIONS

Lin et al. "Lossless compression algorithm based on dictionary coding for multiple e-beam direct write system." Proceedings of the 2016 Conference on Design, Automation & Test in Europe. EDA Consortium, 2016. pp. 4.
Shamoon et al., "A rapidly adaptive lossless compression algorithm for high fidelity audio coding." Proceedings of IEEE Data Compression Conference (DCC. IEEE, 1994. pp. 10.
Sharbahrami et al. "Evaluation of huffman and arithmetic algorithms for multimedia compression standards." arXiv preprint arXiv:1109.0216 (2011). pp. 11.
Tu et al. "Context-based entropy coding of block transform coefficients for image compression." IEEE Transactions on Image Processing 11.11 (2002): 1271-1283. pp. 13.

* cited by examiner

*Primary Examiner* — Howard Williams
(74) *Attorney, Agent, or Firm* — Cantor Colburn LLP; William Kinnaman

(57) ABSTRACT

Embodiments of the present invention are directed to a computer-implemented method for data compression. The method includes monitoring data, from a data stream, stored in an input buffer and system memory of a data compression system. The method further includes choosing an encoding scheme based in part upon the amount of data in the input buffer. The method further includes encoding data using the encoding scheme to compress the data from the data stream. The method further includes reevaluating, during the data stream, an encoding scheme choice based in part upon the amount of data in the input buffer.

17 Claims, 4 Drawing Sheets

DATA COMPRESSION USING DICTIONARY ENCODING

BACKGROUND

The present invention generally relates to data compression, and more specifically, to data compression using dictionary encoding.

Data compression involves modifying, encoding, or converting data elements in a file to reduce the amount of space occupied by the file. These compressed files can later be decompressed to reconstruct the original file. Input data can be entered into an encoder that compresses the data. The compressed data is stored in system memory or other appropriate location. When a user needs to recover the data, a decoder decompresses the file and transmits an approximation or copy of the original file.

Data compression can be divided into lossy compression algorithms and lossless compression algorithms. By compressing the number of data bits, computing devices can reduce the amount of storage space needed for a file, free additional storage for other files, and decrease the workload for resources needed to transmit and receive files. In general data compression techniques offer trade-offs between a degree of compression and fidelity to the original audio, visual, or text data file.

SUMMARY

Embodiments of the present invention are directed to a computer-implemented method for data compression. A non-limiting example of the computer-implemented method includes monitoring data, from a data stream, stored in an input buffer and system memory of a data compression system. The method further includes choosing an encoding scheme based in part upon the amount of data in the input buffer. The method further includes encoding data using the encoding scheme to compress the data from the data stream. The method further includes reevaluating, during the data stream, an encoding scheme choice based in part upon the amount of data in the input buffer.

Embodiments of the present invention are directed to a system for data compression. The computer system includes a memory and a hardware processor system communicatively coupled to the memory. The processor system is configured to perform the computer-implemented method.

Embodiments of the invention are directed to a computer program product for data compression, the computer program product includes a computer readable storage medium having program instructions embodied therewith. The computer product comprises a computer readable storage medium embodied with program instructions. The instructions are executable by a hardware processor and cause the hardware processor to perform the computer-implemented method.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
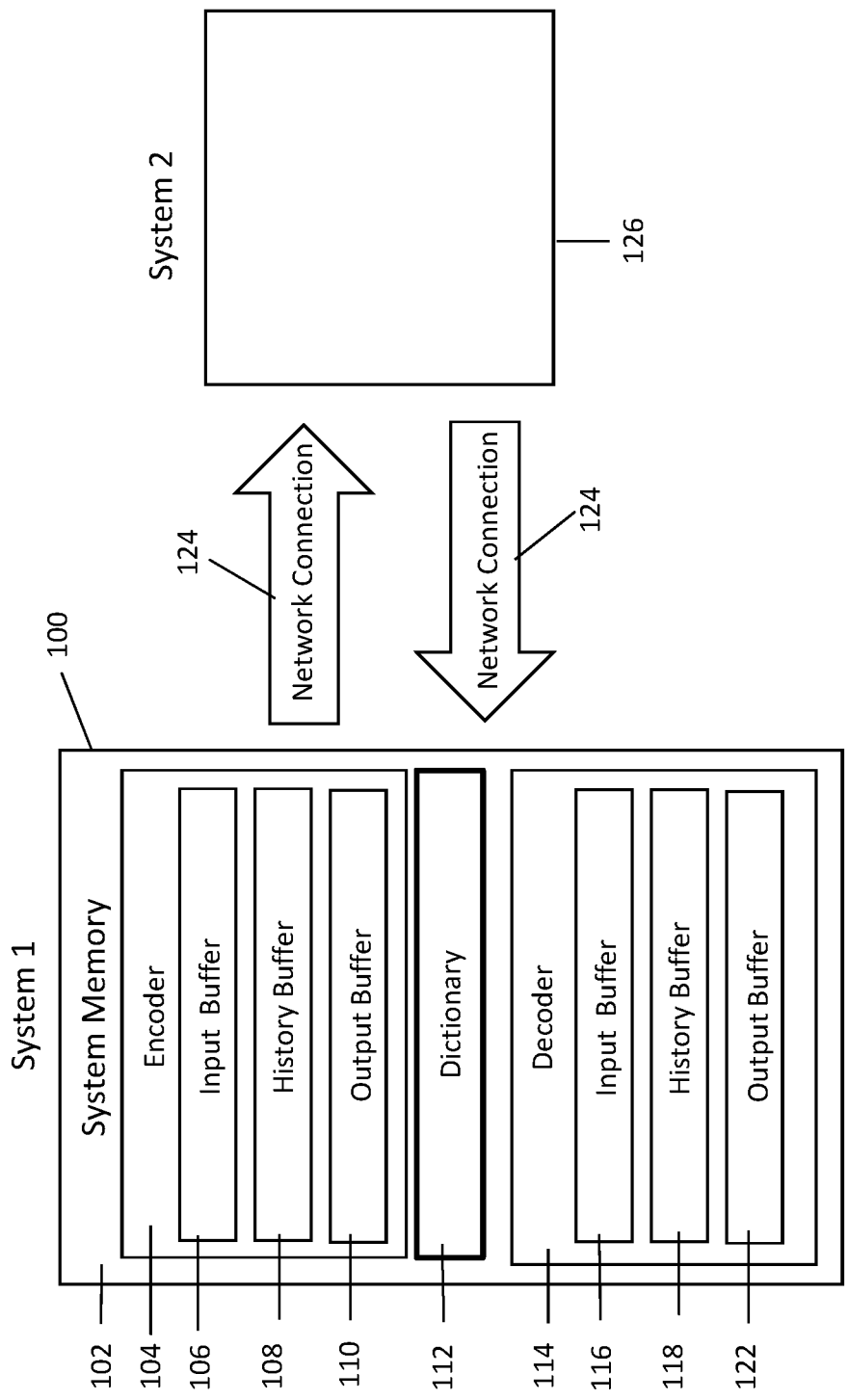
FIG. 1 depicts a block diagram of a general data compression system according to one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, lossy compression includes file compression techniques that discard some data during a compression operation. As a result, the decompressed file will not contain all of the data that the file contained prior to compression. Lossy data compression techniques attempt to identify redundant or unnecessary data and discard this data. JPEG refers to a widely used lossy compression technique that is used to reduce the size of image files. MP3 refers to a lossy compression technique that is commonly used to reduce the size of audio files. Lossy compression techniques can also include sampling at a lower frequency than the Nyquist rate and quantization.

Lossless data compression refers to file compression techniques, in which decompressed files are reconstructed back to the original file. Lossless compression techniques can be divided into entropy encoding and source encoding. Entropy encoding includes repetitive sequence suppression and statistical encoding. Statistical encoding includes pattern substitution and Huffman encoding. An encoder can use statistical analysis to identify repeating patterns in a data set and these repeating patterns can be replaced with symbols. As examples, PNG and GIF refer to lossless visual data compression techniques.

Dictionary-based encoding identifies repeated patterns and replaces these patterns with symbols/references from a dictionary. The dictionary symbols are associated with variable-length strings that are encoded as single tokens. The encoder can create a dictionary that contains each pattern found in the data set and its associated symbol. The symbols can be stored with fewer bits than the patterns that they are replacing. A decoder can decompress the compressed file by replacing symbols with the patterns from the dictionary. In general, both lossy and lossless compression techniques operate under this general framework, however, lossy techniques employ methods that result in loss of data and lossless techniques do not.

Each symbol in the dictionary is a bit or a set of bits. Fixed-length encoding is a system in which each symbol consists of a fixed number of bits. Each set of bits is known as a "codeword." Fixed-length encoding can be convenient because a decoder can scan a string of bits and determine when a symbol begins and ends by the number of bits in each symbol. Variable-length encoding is a technique, in which the number of bits of can vary with each symbol. Generally, more frequently used symbols have shorter bit lengths. As each symbol has a variable length of bits, the code must be uniquely decodable. A uniquely decodable code is a situation, in which no two different strings of symbols equate to the same codeword(s). A code is considered to be prefix-free if no codeword is a prefix of another code word. For example, if a set of codewords is (0, 01, 10, 101), 0 is a prefix of 01 and 10 is a prefix is of 101. The codeword is considered instantaneous if it can be decoded upon reading the bits without knowledge of any subsequent bits.

Entropy encoding is a lossless compression method of determining variable-length codes based upon the frequencies or probabilities that characters will appear in an input data set. Each symbol is assigned a respective prefix-free codeword. These codewords are associated with symbols of respective inputs and together comprise a dictionary of uniquely decodable prefix-free codewords that can be instantaneously decoded. The length of each codeword is proportional to the negative logarithm of the probability that its symbol will be used to replace an input in the data set. In other words, the most commonly used symbols will have the shortest codewords and the least frequently used codewords will have the longest codewords. Examples of entropy encoding techniques include Huffman encoding, arithmetic encoding, or a combination thereof.

In general, dictionary-based compression algorithms store a dictionary of previously used symbols, codewords, and associated inputs to use when encoding future inputs. This information stored in the dictionary can be used for performing frequency analysis of symbols to build optimized encodings. Periodically, during an incoming data stream rebuilds a dictionary. However, conventional data compression systems do not have a dynamic mid-stream process for choosing a data source to perform a frequency or probability analysis and build the dictionary. Embodiments of the present invention provide systems and method that enable an encoder to choose in mid-stream which data source to use to perform a frequency or probability analysis and build a dictionary.

When there is only small amount of input data or in situations in which there is inadequate history in memory available, it is more efficient more efficient to choose one encoding method or another. For example, for small input data sizes, a fixed Huffman encoding is preferable to dynamic Huffman encoding in some cases.

Turning now to an overview of the aspects of the invention, one or more embodiments of the invention address the above-described shortcomings of the prior art by providing provide systems and methods for reusing a dictionary for frequency analysis based upon an input buffer size. The above-described aspects of the invention address the shortcomings of the prior art by enabling an encoder to change data sources to perform a frequency or probability analysis and build a dictionary in mid-stream. A more robust frequency or probability analysis can result in a better choice of an encoding scheme. By varying the techniques mid-stream, the compression ratio can be enhanced. As used herein, the compression ratio refers to a data compression ratio which is defined as the ratio between the uncompressed size and compressed side of data.

Referring to FIG. 1 a block diagram illustrating a general data compression system is shown. Computer system 1 100 can include system memory 102 and be configured to include external memory storage devices (not shown) including hard disk drives, floppy disk drives, tape storage devices, magneto-optical drives, and optical mediums such as a CD-ROM, a digital versatile disk (DVDs), or Blu-Ray disc (BD), or other type of device for electronic data storage.

A compressed data file can be stored on computer system 1 100 and be transmitted to computer system 2 126 through a network connection 124. The network connection 124 can be capable of communication using technologies such as Ethernet, fiber optics, microwave, xDSL (Digital Subscriber Line), Wireless Local Area Network (WLAN) technology, wireless cellular technology, Bluetooth technology and/or any other appropriate communication technology. The compressed data file requires fewer bits and occupies a smaller amount of memory than the original data file. The compressed data file can be decompressed at computer system 2 126. The encoder 104 compression data to form a compressed block of data. The compressed blocks are sequentially written back to a storage device to form a compressed data file.

The encoder 104 and decoder 114 of computer system 1 100 can reside in the system memory 102 of each computer system. The encoder 104 can include an input buffer 106 into which blocks from a data stream are sequentially loaded. The encoder 104 can also include a history buffer 108 and a dictionary 112 to perform a data compression operation. The encoder 104 can also include an output buffer 110, in which compressed data blocks are written sequentially to form a compressed data file.

In some embodiments, the encoder 104 compresses individual blocks of a data file independently and sequentially. In other embodiments, the encoder 104 operates on an entire data file during compression. The encoder 104 can initially store data blocks of data onto an input buffer 106. From the input buffer 106, a data block or a data file can be loaded into a history buffer 108. Each block of data can be a uniform size or the size may vary depending upon an application. The history buffer 108 can be configured to be the same size as a block of data or larger than a single block of data. At the history buffer 108, the encoder 104 replaces data with associated symbols from the dictionary 112. From time to time, the encoder 104 can scan the history buffer 108 and make additions or subtractions from a dictionary 112. After the block or data file has been encoded, the encoder 104 can output the compressed data to an output buffer 110, which can then transmit the compressed data to computer system 2 126. It should be appreciated that that in some embodiments, the input buffer 106 and the output buffer 110 are not included and the encoder 104 can accept data directly into the history buffer 108.

The decoder 114 decompresses data files and outputs a decompressed data file. The decoder 114 can receive compressed data files or blocks of data to an input buffer 116. The input buffer 116 can transmit an entire compressed data file or compressed blocks of data to a history buffer 118. The decoder 114 can replace the symbols of the compressed file to the original data using a dictionary 112. The decompressed data from the history buffer 118 can be written to an output buffer 122. It should be appreciated that that in some embodiments, the input buffer and the out buffer are not included and the decoder 114 can accept data directly to the history buffer 118.

The encoder 104 can include direct cosine transform (DCT) circuitry for performing a DCT operation on each block of input data. The input data can include visual, audio, and textual data. The encoder 104 further can include a quantizer for quantizing transformed coefficients received from the DCT circuitry. Additionally, in some embodiments, the encoder 104 includes Huffman encoding circuitry 104 for encoding the output received from the quantizer. The Huffman encoding circuitry can be configured to perform static or dynamic Huffman encoding. In other embodiments of the present invention, the Huffman encoding circuitry can be replaced or supplemented with other appropriate circuitry, including arithmetic circuitry, or other data compression scheme circuitry. The encoder 104 uses encoding circuitry to perform the variable-length encoding on the data blocks from the input data streams. The encoder can perform a pass-through of an entire block of data to determine a symbol frequency. The length of a symbol can be inversely related to its frequency of use. In other embodiments, the encoder can pass-through a portion of a block to predict a probability that a symbol will be observed. The length of a symbol can also be inversely related to its probability of use.

The dictionary 112 is a data structure for mapping symbols to inputs from data sets. The dictionary 112 can be in the form of a hash table, a red-black tree, or any other appropriate data structure. The dictionary 112 can be configured such that the dictionary 112 is static or dynamic (adaptive). A static dictionary is permanent and does not account for subtraction or addition of entries. A dynamic dictionary stores strings found in input data streams and allows for the subtraction or addition of entries. The system memory 102 can store dictionary values derived from previous encoding operations.

Entropy encoding associates the more frequently used symbols with smaller bit sizes and less frequently used symbols to have symbols of larger bit sizes. However, the analysis to determine which symbols are more frequently used is time and resource intensive. Therefore, conventional compression operations do not perform this analysis for every input, but instead reperform the frequency or probability analysis over a fraction of the inputs.

Periodically during an incoming input data stream, the data compression system will regenerate the encoding of the input data. The determination of when to initiate a new encoding scheme can be determined by various methods and algorithms. Conventional data compression systems statically adopt encoding schemes during data compression. Data compression rations could be more increased if an encoding scheme could be dynamically chosen during an incoming data stream. The optimal encoding scheme can be determined by analyzing the results of a frequency or probability analysis. A frequency analysis generates more accurate results in relation to the size of the data set used to perform the analysis. The encoder can be configured to monitor the size, or the number of bytes, of the incoming data stream. The encoder can also be configured to monitor current requests. The values for the frequency of the symbols or probability that the symbols will be observed are maintained until the next instance of regeneration of the encoding.

The encoder uses an encoding scheme until the subsequent regeneration of encoding data. In order to make the determination, the data size used should be sufficient to choose the appropriate encoding scheme. A large current input data size, for example, greater than 4 kB, can be used to build the encoding. In cases where the input is very small, for example, less than 4 kB, the existing history can be used to build the encoding. In cases in which there is a very small amount of historic input data in the history buffer, a pre-defined encoding scheme can be used. The pre-defined encoding scheme can be a fixed Huffman encoding scheme or a pre-defined dynamic Huffman encoding scheme.

Figure 2:
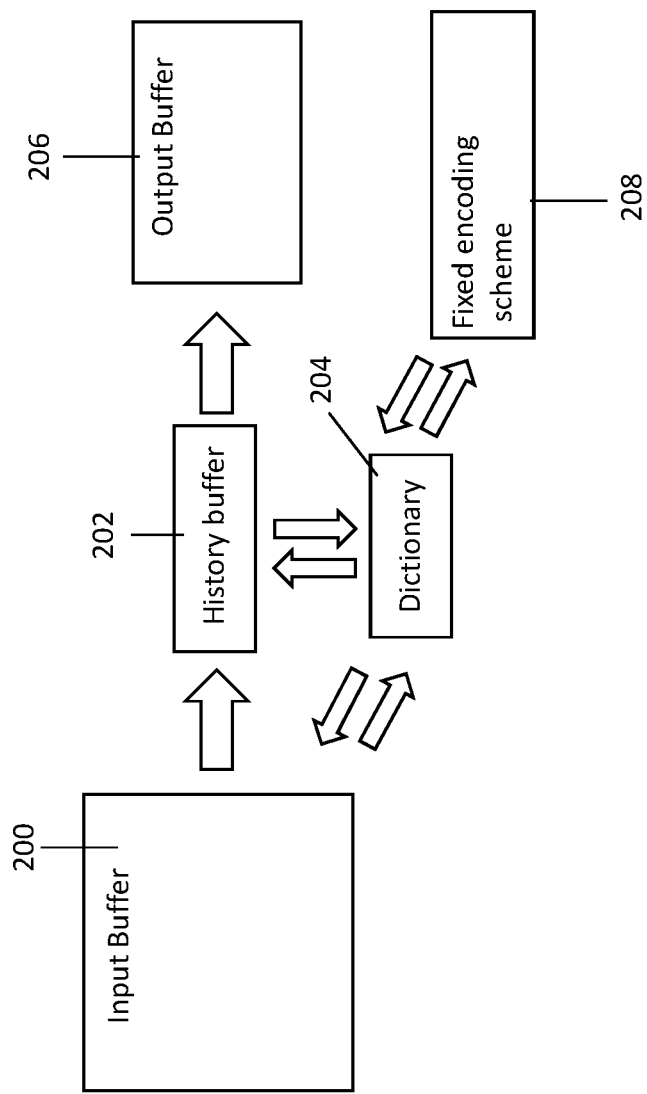
FIG. 2 depicts a block diagram illustrating a process of a dynamic determination of encoding scheme according to one or more embodiments of the present invention.

Referring a to FIG. 2, a block diagram illustrating a data compression process according to embodiments of the present invention, is seen. Input data can be stored at an input buffer 200 and written to a history buffer 202. An entire input data file can be written to the history buffer 202 or blocks of input data can be sequentially written to the history buffer 202. The encoder can encode the data at the history buffer 202 and write the compressed data to an output buffer 206. The history buffer 202 stores the original block of data and accepts an additional block of data from the input buffer 200. The history buffer 202 continues to accumulate blocks of data until a maximum storage capacity is reached. When a maximum storage capacity is reached the encoder creates space for a new block of data by removing the oldest block of data from the history buffer 202. The aggregate data stored in the history buffer 202 can be considered historic input data. From time to time, either during an input data stream or between input data streams, the encoder performs a frequency or probability analysis and determine a best possible encoding scheme.

During data compression, data begins to stream into an input buffer 200 and is written to history buffer for encoding. Compressed data from the history buffer 202 is written to the output buffer 206. During this process, the encoder is continuously replacing data in the history buffer with symbols from the dictionary 204. The data blocks can be stored on a first in first out (FIFO) basis. The data blocks can be stored sequentially in the aggregate until the entire data stream is complete. Even as the encoder is performing the frequency or probability analysis, it can be configured to continuously monitor the amount of data in the input buffer 200 and the history buffer 202. If at some point during data compression, the amount of data in the input buffer 200 exceeds a first threshold amount, the encoder can perform the frequency or probability analysis using data from the input buffer 200. The encoder can build the dictionary be encoding the data in the input buffer 200 using a dynamic Huffman encoding scheme. If at some point the data falls below the first threshold amount, the encoder can detect whether the amount of historic input data in the history buffer 202 exceeds a second threshold amount. If the amount of data in the history buffer 202 exceeds the second threshold amount, the encoder can perform a frequency or probability analysis on the data in the history buffer 202. The encoder can build the dictionary be encoding the data in the history buffer 202 using a dynamic Huffman encoding scheme. If the amount of data in the history buffer 202 is below the second threshold, the encoder can adopt a pre-defined encoding scheme.

The encoder is configured to monitor the amount of data available in the input buffer 200 and the history buffer 202. The encoder is configured with reference characteristics that dictate which encoding scheme to adapt based upon the results of a frequency or probability analysis. Prior to each time the encoder performs a frequency or probability analysis, it detects the amount of data stored in the input buffer 200 and the amount of data stored in history buffer 202. If the amount of data in the input buffer 200 is greater than a first threshold amount, for example, 4 kB, the encoder will use the data stored in the input buffer 200 to perform the analysis. If the amount of data is less than a first threshold amount, the encoder can use the history input data in the history buffer 202 to perform the analysis. If the data is less than a second threshold amount that is less than the first threshold amount, the encoder can be configured to run a pre-defined encoding scheme 208. A pre-defined encoding scheme is advantageous when there is limited data to perform the frequency or probability analysis. In either case, the encoder can be configured to continuously monitor the size of the data stored in the input buffer 200 and in system memory 208 and switch to a variable-length encoding scheme upon the amount of data surpassing the first or second threshold.

Figure 3:
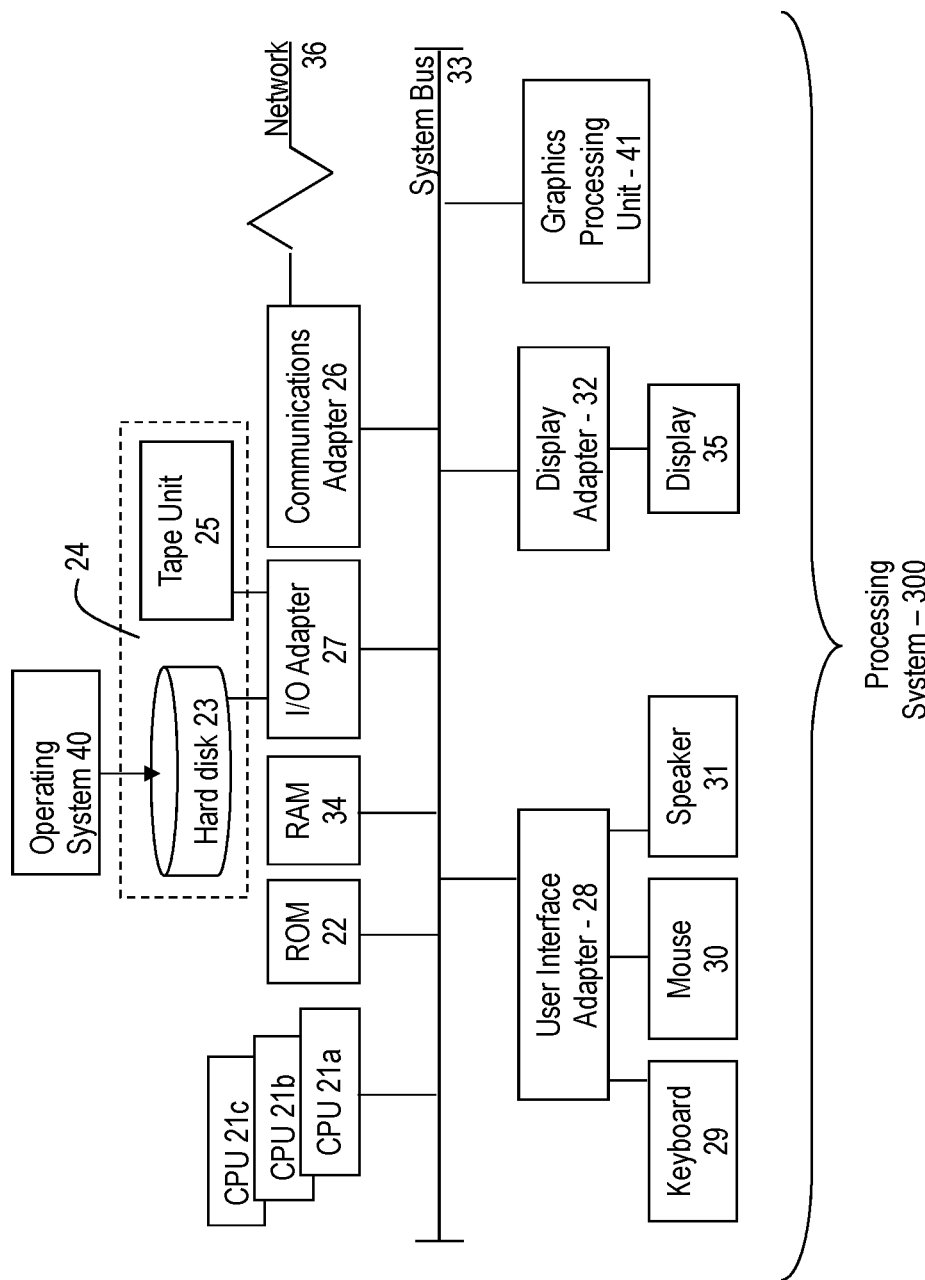
FIG. 3 depicts a block diagram of a computer system for use in implementing one or more embodiments of the present invention.

Referring to FIG. 3, there is shown an embodiment of a processing system 300 for implementing the teachings herein. In this embodiment, the system 300 has one or more central processing units (processors) 21a, 21b, 21c, etc. (collectively or generically referred to as processor(s) 21). In one or more embodiments, each processor 21 may include a reduced instruction set computer (RISC) microprocessor. Processors 21 are coupled to system memory 34 and various other components via a system bus 33. Read only memory (ROM) 22 is coupled to the system bus 33 and may include a basic input/output system (BIOS), which controls certain basic functions of system 300.

FIG. 3 further depicts an input/output (I/O) adapter 27 and a network adapter 26 coupled to the system bus 33. I/O adapter 27 may be a small computer system interface (SCSI) adapter that communicates with a hard disk 23 and/or tape storage drive 25 or any other similar component. I/O adapter 27, hard disk 23, and tape storage device 25 are collectively referred to herein as mass storage 24. Operating system 40 for execution on the processing system 300 may be stored in mass storage 24. A network adapter 26 interconnects bus 33 with an outside network 36 enabling data processing system 300 to communicate with other such systems. A screen (e.g., a display monitor) 35 is connected to system bus 33 by display adaptor 32, which may include a graphics adapter to improve the performance of graphics intensive applications and a video controller. In one embodiment, adapters 27, 26, and 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 all interconnected to bus 33 via user interface adapter 28, which may include, for example, a Super I/O chip integrating multiple device adapters into a single integrated circuit.

In exemplary embodiments, the processing system 300 includes a graphics processing unit 41. Graphics processing unit 41 is a specialized electronic circuit designed to manipulate and alter memory to accelerate the creation of images in a frame buffer intended for output to a display. In general, graphics processing unit 41 is very efficient at manipulating computer graphics and image processing and has a highly parallel structure that makes it more effective than general-purpose CPUs for algorithms where processing of large blocks of data is done in parallel.

Thus, as configured in FIG. 3, the system 300 includes processing capability in the form of processors 21, storage capability including system memory 34 and mass storage 24, input means such as keyboard 29 and mouse 30, and output capability including speaker 31 and display 35. In one embodiment, a portion of system memory 34 and mass storage 24 collectively store an operating system coordinate the functions of the various components shown in FIG. 3.

Figure 4:
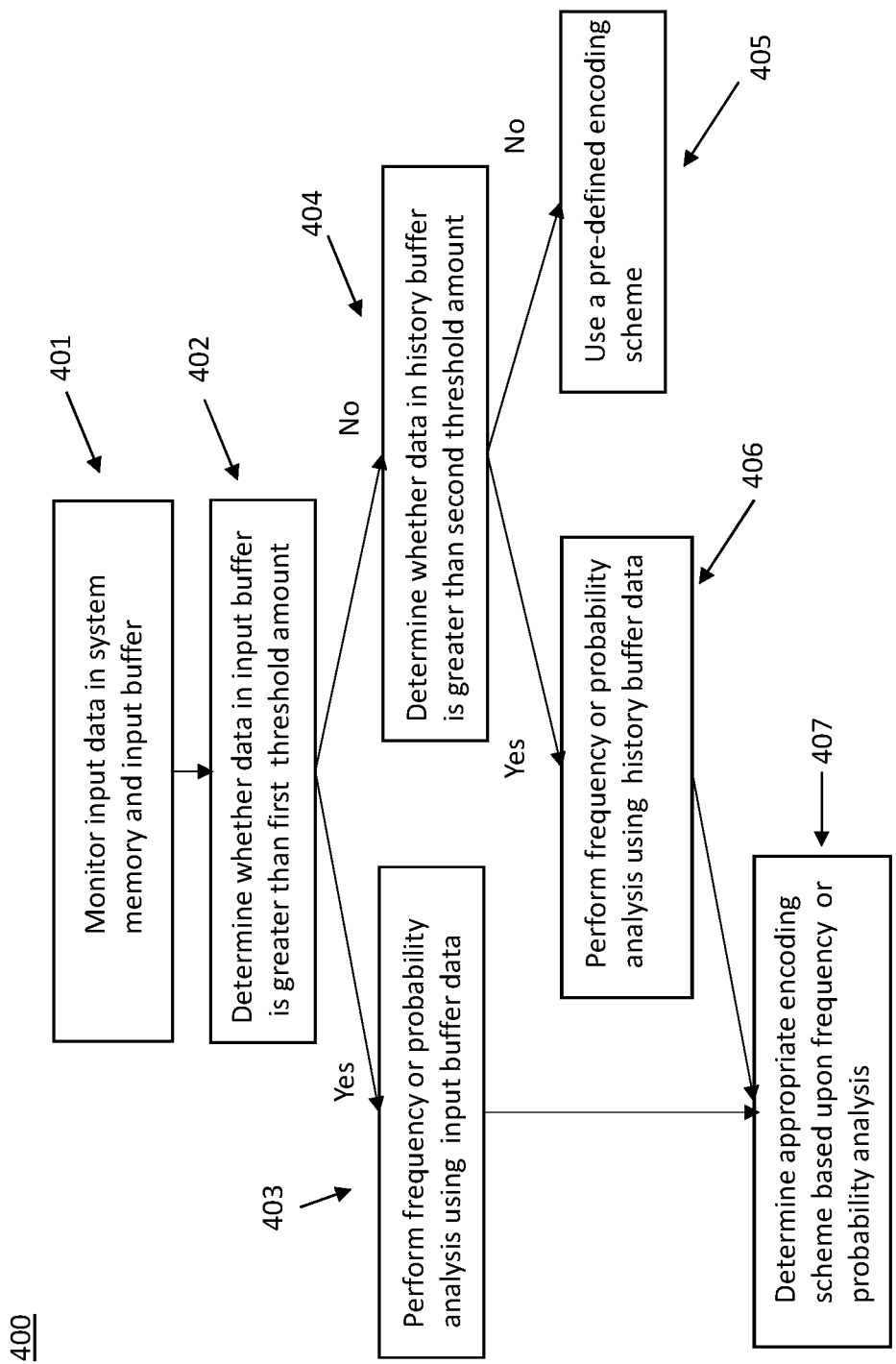
FIG. 4 depicts a flow diagram of a method for data compression according to one or more embodiments of the invention.

FIG. 4 depicts a flow diagram of a method for data compression according to one or more embodiments of the invention. The method 400 includes monitoring the amount of data from an incoming data stream that is stored in an input buffer 401. As the encoder begins to regenerate encoding, the encoder can be configured to determine whether the data in the input buffer is greater than a first threshold amount 402. The first threshold amount can be either uniform across all applications content, format, or time; or be dependent on one or more of these characteristics. If the input buffer contains more data than the first threshold amount, then the encoder can perform a frequency or probability analysis using data from the input buffer 403.

If the input buffer contains less data than the first threshold amount, the encoder can determine whether the history buffer has more historic input data than a second threshold amount 404. The second threshold amount can be greater than or less than the first threshold amount. If the history buffer has less data than a second threshold amount, the encoder can use a pre-defined encoding scheme 405. The pre-defined encoding scheme can be a single pre-defined encoding scheme or selected from a set of pre-defined encoding schemes. The pre-defined encoding scheme can be a fixed Huffman encoding scheme. If the history buffer contains more data than the second threshold amount, then the encoder can perform a frequency or probability analysis using history input data from the history buffer 406. After a frequency or probability analysis has been performed using either the input buffer or the history buffer, the encoder can choose an optimal encoding scheme based on the frequency or probability analysis 407. The encoder will continue to compress data until the data stream ceases.

Additional processes may also be included. It should be understood that the processes depicted in FIG. 4 represent illustrations, and that other processes may be added or existing processes may be removed, modified, or rearranged without departing from the scope and spirit of the present disclosure.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for data compression, the method comprising:
monitoring data, from a data stream, stored in an input buffer and system memory of a data compression system;
choosing an encoding scheme based in part upon an amount of data in the input buffer;
encoding data using the encoding scheme to compress the data from the data stream; and
periodically, while the data stream is active, reevaluating an encoding scheme choice based in part upon the amount of data in the input buffer,
wherein, responsive to a determination that an amount of data in the input buffer is less than a first threshold amount, the method further comprises:
determining that the amount of historic input data in system memory is greater than a second threshold amount;
performing a frequency analysis of the historic input data in the system memory; and
choosing an encoding scheme based upon the frequency analysis.

2. The computer-implemented method of claim 1, wherein, responsive to a determination that an amount of data in the input buffer is greater than a first threshold amount, the method further comprises:
performing a frequency analysis of the data in the input buffer; and
choosing an encoding scheme based upon the frequency analysis.

3. The computer-implemented method of claim 2, wherein the encoding scheme is a Huffman encoding scheme.

4. The computer-implemented method of claim 1, wherein, responsive to a determination that an amount of data in the input buffer is greater than a first threshold amount, the method further comprises:
performing a probability analysis of the data in the input buffer; and
choosing an encoding scheme based upon the probability analysis.

5. The computer-implemented method of claim 1, wherein, responsive to a determination that an amount of data in the input buffer is less than a first threshold amount and an amount of historic input data in system memory is less than a second threshold amount, the method further comprises:
encoding the input data using a pre-defined encoding scheme; and
periodically, during the data stream, reevaluating an encoding scheme choice based in part upon the amount of data in the input buffer.

6. The computer implemented method of claim 5, wherein the pre-defined encoding scheme is either a fixed Huffman encoding scheme or a pre-defined dynamic Huffman encoding scheme.

7. A system comprising:
a processor communicatively coupled to a memory, the processor configured to:
monitor data, from a data stream, stored in an input buffer and system memory of a data compression system;
choose an encoding scheme based in part upon an amount of data in the input buffer;
encode data using the encoding scheme to compress the data from the data stream; and
periodically, while the data stream is active, reevaluate an encoding scheme choice based in part upon the amount of data in the input buffer,
wherein, responsive to a determination that an amount of data in the input buffer is less than a first threshold amount, the processor is further configured to:
determine that the amount of historic input data in system memory is greater than a second threshold amount;
perform a frequency analysis of the historic input data in the system memory; and
choose an encoding scheme based upon the frequency analysis.

8. The system of claim 7, wherein, responsive to a determination that an amount of data in the input buffer is greater than a first threshold amount, the processor is further configured to:
perform a frequency analysis of the data in the input buffer; and
choose an encoding scheme based upon the frequency analysis.

9. The system of claim 8, wherein the encoding scheme is a Huffman encoding scheme.

10. The system of claim 7, wherein, responsive to a determination that an amount of data in the input buffer is greater than a first threshold amount, the processor is further configured to:
perform a probability analysis of the data in the input buffer; and
choose an encoding scheme based upon the probability analysis.

11. The system of claim 7, wherein, responsive to a determination that an amount of data in the input buffer is less than a first threshold amount and an amount of historic input data in system memory is less than a second threshold amount, the processor is further configured to:
- encode the input data using a pre-defined encoding scheme; and
- periodically, during the data stream, reevaluate an encoding scheme choice based in part upon the amount of data in the input buffer.

12. The system of claim 11, wherein the pre-defined encoding scheme is either a fixed Huffman encoding scheme or a pre-defined dynamic Huffman encoding scheme.

13. A computer program product for data compression, the computer product comprising a computer readable storage medium having program instructions embodied therewith, the instructions executable by a processor to cause the processor to:
- monitor data, from a data stream, stored in an input buffer and system memory of a data compression system;
- choose an encoding scheme based in part upon an amount of data in the input buffer;
- encode data using the encoding scheme to compress the data from the data stream; and
- periodically, while the data is active, reevaluate an encoding scheme choice based in part upon the amount of data in the input buffer,
- wherein, responsive to a determination that an amount of data in the input buffer is less than a first threshold amount, the instructions further cause the processor to:
- determine that the amount of historic input data in system memory is greater than a second threshold amount;
- perform a frequency analysis of the historic input data in the system memory; and
- choose an encoding scheme based upon the frequency analysis.

14. The computer program product of claim 13, wherein, responsive to a determination that an amount of data in the input buffer is greater than a first threshold amount, the instructions further cause the processor to:
- perform a frequency analysis of the data in the input buffer; and
- choose an encoding scheme based upon the frequency analysis.

15. The computer program product of claim 13, wherein, responsive to a determination that an amount of data in the input buffer is greater than a first threshold amount, the instructions further cause the processor to:
- perform a probability analysis of the data in the input buffer; and
- choose an encoding scheme based upon the probability analysis.

16. The computer program product of claim 13, wherein, responsive to a determination that an amount of data in the input buffer is less than a first threshold amount and an amount of historic input data in system memory is less than a second threshold amount, the instructions further cause the processor to:
- encoding the input data using a pre-defined encoding scheme; and
- periodically, during the data stream, reevaluating an encoding scheme choice based in part upon the amount of data in the input buffer.

17. The computer program product of claim 16, wherein the pre-defined encoding scheme is either a fixed Huffman encoding scheme or pre-defined dynamic Huffman encoding scheme.

* * * * *